United States Patent
Menard et al.

(10) Patent No.: US 7,161,191 B2
(45) Date of Patent: Jan. 9, 2007

(54) HF-CONTROL SCR SWITCH STRUCTURE

(75) Inventors: Samuel Menard, Tours (FR); Christophe Mauriac, Fondettes (FR)

(73) Assignee: STMicroelectronics S.A., Montrouge (FR)

( * ) Notice: Subject to any disclaimer, the term of this patent is extended or adjusted under 35 U.S.C. 154(b) by 0 days.

(21) Appl. No.: 10/963,384

(22) Filed: Oct. 12, 2004

(65) Prior Publication Data

US 2005/0082566 A1   Apr. 21, 2005

(30) Foreign Application Priority Data

Oct. 17, 2003   (FR) .................................. 03 50703

(51) Int. Cl.
*H01L 29/74* (2006.01)

(52) U.S. Cl. ...................... 257/119; 257/173; 257/174; 257/355; 257/356; 257/358

(58) Field of Classification Search ................ 257/173, 257/174, 355, 356, 357, 358, 360, 365, 119
See application file for complete search history.

(56) References Cited

U.S. PATENT DOCUMENTS 3,140,963 A   7/1964   Sevedberg 5,898,205 A * 4/1999 Lee ............................ 257/355
6,323,718 B1   11/2001 Rault et al.

OTHER PUBLICATIONS

French Search Report from corresponding French National Application No. 03.50703, filed Oct. 17, 2003.
Patent Abstracts of Japan vol. 007, No. 247 (E-208), Nov. 2, 1983 & JP 58 134471 A (Mitsubishi Denki KK).

* cited by examiner

*Primary Examiner*—Leonardo Andujar
*Assistant Examiner*—Tan Tran
(74) *Attorney, Agent, or Firm*—Lisa K. Jorgenson; James H. Morris; Wolf, Greenfield & Sacks, P.C.

(57) ABSTRACT

A vertical SCR-type switch including a control area having a first control region forming a first diode with a first neighboring region or layer, and a second control region forming a second diode with a second neighboring region or layer. A contact is formed on each of the first and second control regions and on each of the first and second neighboring regions or layers. The contacts are connected to terminals of application of an A.C. control voltage so that, when an A.C. voltage is applied, each of the two diodes is alternately conductive.

13 Claims, 7 Drawing Sheets

HF-CONTROL SCR SWITCH STRUCTURE

BACKGROUND OF THE INVENTION

1. Field of the Invention

The present invention generally relates to vertical SCR-type switches. "SCR-type switches" is used to designate components such as thyristors, triacs, and other controlled bi-directional switches comprising at least four or five semiconductor layers of alternated doping types.

2. Discussion of the Related Art

FIG. 1 is a cross-section view of a conventional thyristor structure. The thyristor comprises an N-type cathode region 1, formed in a P-type well 2, itself formed in a lightly-doped N-type substrate 3, and a P-type anode region 4 on the rear surface side. A thyristor in which substrate 3 is surrounded with a P-type insulating wall 5 in contact with anode 4 has been shown. P-type well 2 corresponds to a cathode-gate area. The front surface of the thyristor is covered with an insulating layer 6. A cathode metallization MK connected to a cathode terminal K is in contact with cathode region 1. A gate metallization MG connected to a gate terminal G is in contact with well 2. The rear surface of the component is coated with an anode metallization MA connected to an anode terminal A.

Cathode region 1 as well as other portions of well 2, of substrate 3, and of anode region 4 located underneath form a power area through which a significant current flows when the thyristor is activated. The thyristor elements located above and close to gate metallization MG form a control area which is active upon turning-on of the thyristor.

FIG. 2 is a diagram of an HF control circuit 10 of a thyristor 11 inserted in a power circuit 12, such as described in U.S. patent application Ser. No. 10/727,189, filed Dec. 3, 2003, which is incorporated herein by reference. Power circuit 12 is schematically shown as a voltage generator V1 and a load L in series between the anode and the cathode of thyristor 11. Control circuit 10 is intended to apply a current between gate G and cathode K of the thyristor and essentially comprises in series a sinusoidal high-frequency HF voltage generator and a switch Sw. The above-mentioned patent application explains that, even though the power provided by the control circuit during each period is smaller than the power necessary to turn on the thyristor, said thyristor surprisingly turns on after a number of periods.

When the power provided by the control circuit is much smaller than the power required to turn on the thyristor, the switch activation time may however be relatively long.

Further, the thickness and the doping profile of the elements of the thyristor of FIG. 1 are most often optimized to improve the thyristor conductivity as well as its breakdown voltage, which often goes against an optimization of the switch starting. The structural features of the thyristor are thus not favorable to the reduction of the activation time.

The control of a thyristor with a high-frequency signal enables providing a galvanic isolation between the HF voltage generator and the thyristor by placing a first capacitor between switch Sw and gate G of the thyristor and a second capacitor between the HF generator and cathode K of the thyristor. The first capacitor can be integrated in the thyristor by providing an insulating layer between the gate metallization and the gate semiconductor area. The second capacitor however cannot be integrated in similar fashion since a capacitor cannot be placed on a "power" path conducting strong D.C. currents or currents at the low mains frequency. A complete galvanic isolation thus requires providing a discrete capacitor between the HF generator and the thyristor cathode. Now, generally, it is rather desired to decrease the number of discrete components for reasons of cost, space, and reliability.

SUMMARY OF THE INVENTION

An object of the present invention is to provide an SCR-type switch that can be rapidly activated with a reduced activation power.

Another object of the present invention is to provide such a switch, the control circuit of which can be galvanically isolated from the power circuit.

To achieve these and other objects, the present invention provides a vertical SCR-type switch comprising a control area comprising a first control region forming a first diode with a first neighboring region or layer, in which:

the control area further comprises a second control region forming a second diode with a second neighboring region or layer, a contact is formed on each of the first and second control regions and on each of the first and second neighboring regions or layers, said contacts are connected to terminals of application of an A.C. control voltage so that, when an A.C. voltage is applied, each of the two diodes is alternately conductive.

According to an embodiment of the present invention, the vertical switch comprises at least four "main" semiconductor layers of alternated doping types through which a significant current is capable of running from the front surface to the rear surface between two main terminals, and in which the first and second control regions are each formed either in one of the main layers or in a control well formed in one of the main layers, the two control regions forming with the main layer or the control well(s) in which they are formed two diodes each capable of starting the switch and, for each diode, the electrode corresponding to a control region is connected to a first control terminal by one of said contacts, the other electrode being connected to a main terminal and/or to a second control terminal by one of said contacts, the switch being capable of being activated by a circuit applying an A.C. voltage such that each of the two diodes is alternately conductive.

According to an embodiment of the present invention, the first main layer is formed on the front surface side in the second main layer, the second layer and possibly the third and the fourth main layers emerging on the front surface side, and the two control regions are each formed in one of the second, third, or fourth layers, and the control well(s) are formed in one of the third or fourth main layers.

According to an embodiment of the present invention, the switch is of thyristor type and comprises four main layer: a cathode region of a first doping type on the upper surface side, formed in a well of a second doping type, itself formed in a substrate of the first doping type, and an anode region of the second doping type formed on the rear surface side, the cathode region being connected to a main cathode terminal, the anode region being connected to a main anode terminal.

According to an embodiment of the present invention, the two control regions are regions of the first doping type formed in said well, a metallization connected to a second control terminal being in contact with said well.

According to an embodiment of the present invention, the two control regions are first and second regions of the first doping type, the first region being formed in said well, the second region being formed in a second well of the second doping type formed in said substrate, the first region being connected to the second well and to one of the control terminals, the second region being connected to said well and to the other control terminal.

According to an embodiment of the present invention, the switch is of triac type and comprises five main layers: a first region of a first doping type, formed in a well of a second doping type, itself formed in a substrate of the first doping type, a layer of the second doping type adjacent to the lower portion of the substrate and a second region of the first doping type formed in the layer on the rear surface side, the first region and the well being connected at its front surface to a main terminal, the second region and said layer being connected at their rear surface to the other main terminal.

According to an embodiment of the present invention, the two control regions are first and second regions of the first doping type, the first region being formed in said well, the second region being formed in a second well of the second doping type formed in said substrate, the first region being connected to the second well and to one of the control terminals, the second region being connected to said well and to the other control terminal.

According to an embodiment of the present invention, the two control region are first and second regions of the first doping type, respectively formed in second and third wells of the second doping type formed in said substrate, the first region being connected to the third well and to one of the control terminals, the second region being connected to the second well and to the other control terminal.

According to an embodiment of the present invention, the two control regions are regions of the first doping type formed in said well.

According to an embodiment of the present invention, the switch is of controlled bi-directional type, in which the control area is placed in the upper portion of an insulating wall or in the immediate vicinity thereof.

The foregoing objects, features, and advantages of the present invention will be discussed in detail in the following non-limiting description of specific embodiments in connection with the accompanying drawings.

DETAILED DESCRIPTION

As usual in the representation of integrated circuits, FIGS. 1, 3, 7, 9 to 11, 13, 14, 16, and 17 are not drawn to scale.

The present invention aims at transforming the structure of an SCR switch to form two diodes capable of starting the switch. A high-frequency signal is applied across each of the two diodes so that each diode is alternately conductive. The use of two halfwaves of the HF signal enables reducing the time required to activate the SCR switch. Various embodiments of a switch according to the present invention will be described hereafter, taking as an example a thyristor, a triac, and another bi-directional switch.

1. Thyristor 1.1 First Embodiment of a Thyristor

Figure 1:
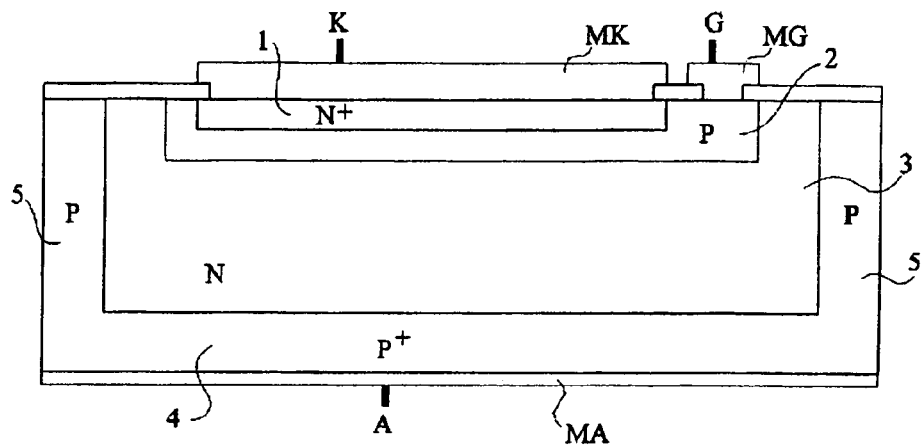
FIG. 1 is a cross-section view, previously described, of a thyristor according to prior art.
Figure 2:
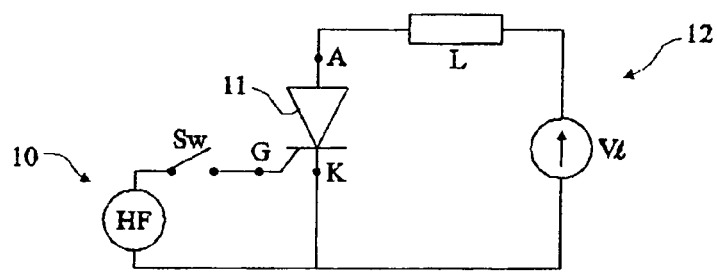
FIG. 2 is a diagram, previously described, of a circuit of HF control and of use of a thyristor according to prior art.
Figure 3:
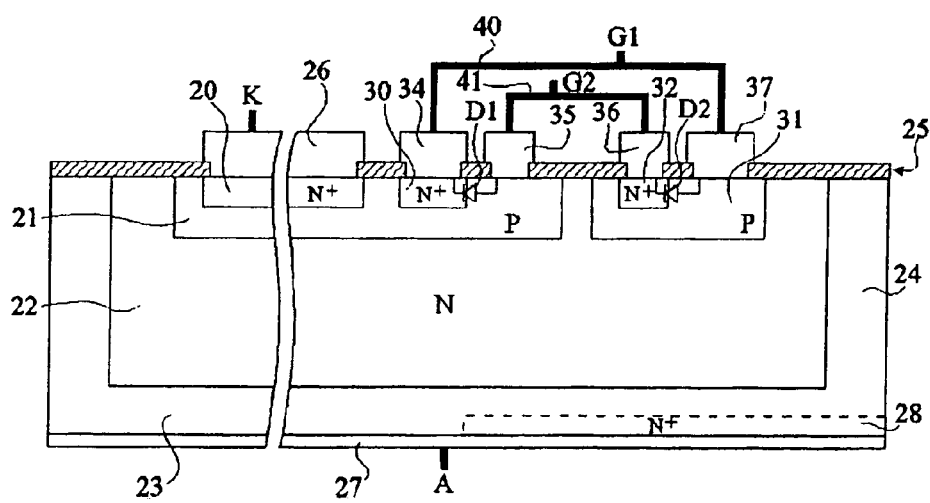
FIG. 3 is a cross-section view of a thyristor according to the present invention.

FIG. 3 is a cross-section view of a thyristor according to an embodiment of the present invention. The thyristor power area is substantially identical to that of the conventional thyristor of FIG. 1 and comprises a heavily-doped N-type cathode region 20, formed in a P-type well 21, itself formed in a lightly-doped N-type substrate 22, and a P-type anode region 23 on the rear surface side of the thyristor. Substrate 22 is surrounded with a P-type insulating wall 24 in contact with anode region 23. The front surface of the thyristor is covered with an insulating layer 25, except at given contact areas. A cathode metallization 26 connected to a cathode terminal K is in contact with cathode region 20. The rear surface of the component is coated with an anode metallization 27 connected to an anode terminal A.

The thyristor elements specific to the present invention belong to a control area defined hereafter. A heavily-doped N-type region 30 is formed in P-type well 21. A P-type well 31 is formed in substrate 22, to the right of well 21 in this example. A heavily-doped N-type region 32 is formed in well 31. Metallizations 34, 35, 36, and 37 are respectively in contact with region 30, well 21, region 32, and well 31. In this example, metallization 34 is connected to metallization 37 by a schematically shown conductive line 40, and metallization 35 is connected to metallization 36 by a conductive line 41. Lines 40 and 41 may be formed conventionally on an insulating layer covering the active thyristor structure. Lines 40 and 41 are respectively connected to two gate terminals G1 and G2.

N-type region 30 and P-type well 21 form a diode D1. N-type region 32 and P-type well 31 form a diode D2. Diodes D1 and D2 are connected according to opposite polarities between gate terminals G1 and G2.

Figure 4:
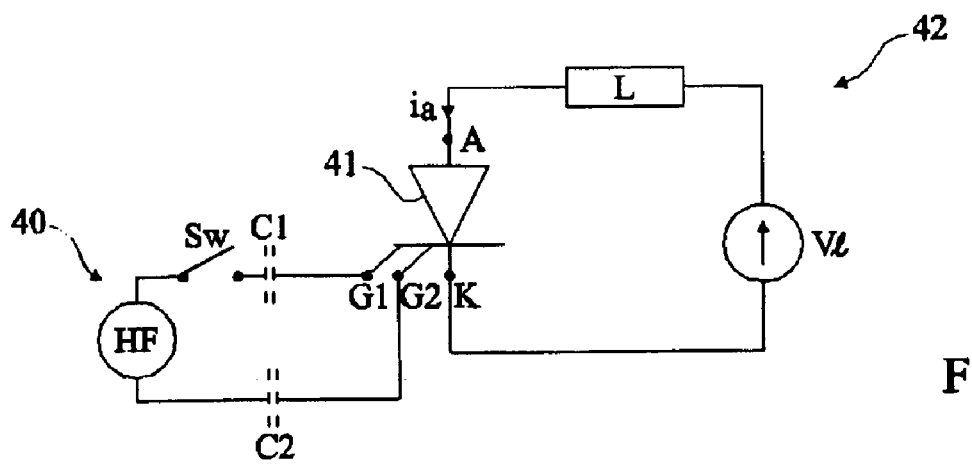
FIG. 4 is a diagram of a circuit of HF control and of use of a thyristor according to an embodiment of the present invention.

FIG. 4 is a diagram of a control circuit 40 of a thyristor 41 inserted in a power circuit 42. Thyristor 41 is a thyristor according to the present invention having the structure shown in FIG. 3. Conversely to a conventional thyristor, thyristor 41 comprises two gate terminals G1 and G2. Power circuit 42 is shown as previously as a voltage generator V1 and a load L in series between anode A and cathode K of the thyristor. Control circuit 40 is intended to apply a high-frequency signal between gate terminals G1 and G2 of the thyristor and comprises a sinusoidal high-frequency voltage generator in series with a switch Sw.

Figure 5:
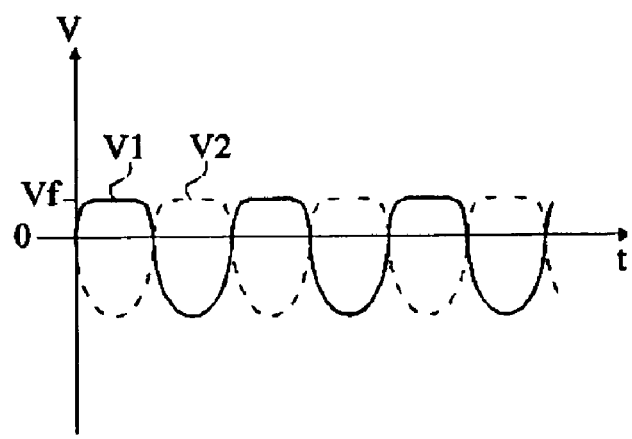
FIG. 5 is a timing diagram of the voltages across two diodes of the thyristor of FIG. 4.

FIG. 5 is a timing diagram of voltages V1 and V2 respectively across diodes D1 and D2 of thyristor 41 such as shown in FIG. 3. On a halfwave of the HF signal, diode D1 is conductive and voltage V1 is substantially equal to the forward voltage drop Vf of the diode. During this same halfwave, diode D2 is non-conductive and voltage V2 follows the sinusoidal variations of the high-frequency signal. At the next halfwave of the HF signal, diode D2 is conductive and voltage V2 is substantially equal to voltage Vf. During this same halfwave, diode D1 is non-conductive and voltage V1 follows the variations of the HF signal. The two described halfwaves correspond to one period of the high-frequency signal. These two halfwaves are repeated as long as switch Sw is on, that is, as long as control circuit 40 is active. When one of diodes D1 and D2 is conductive, charges are "injected" in the vicinity of the blocking thyristor junction. The substantially continuous injection of charges causes a charge accumulation and enables progressive creation of a current between anode A and cathode K of thyristor 41.

Figure 6:
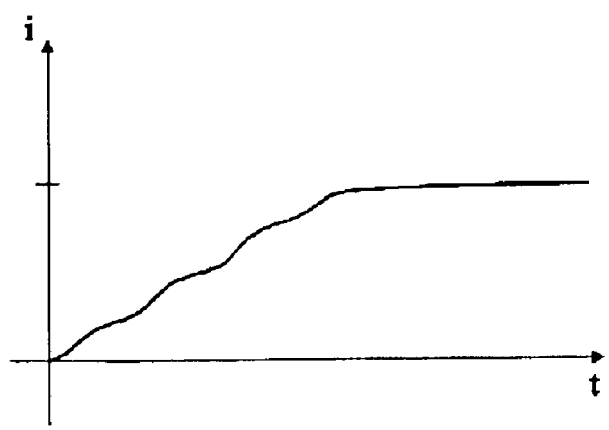
FIG. 6 is a timing diagram of the current flowing through the thyristor of FIG. 4.

FIG. 6 is a timing diagram of anode-cathode current i of thyristor 41. Current i is initially zero and, after activation of control circuit 40, progressively increases until the gate current has completely turned on the thyristor.

As illustrated in FIG. 3, to improve the efficiency of the injected charges, on the rear surface side of the component, a heavily-doped N-type area 28 may be provided in P-type region 23, above well 31 and the right-hand portion of well 21, in which is formed region 30, which favors the localization of the injected charges towards the thyristor power area.

In the case where control circuit 40 of thyristor 41 is desired to be galvanically isolated, two capacitors C1 and C2, shown in dotted lines in FIG. 4, may be provided, respectively between gate terminal G1 and switch Sw and between gate terminal G2 and the HF generator. Capacitors C1 and C2 may be integrated in thyristor 41, for example, by providing four thin insulating layers between metallizations 34, 35, 36, and 37 and, respectively, region 30, well 21, region 32, and well 31.

1.2. Second Embodiment of a Thyristor

Figure 7:
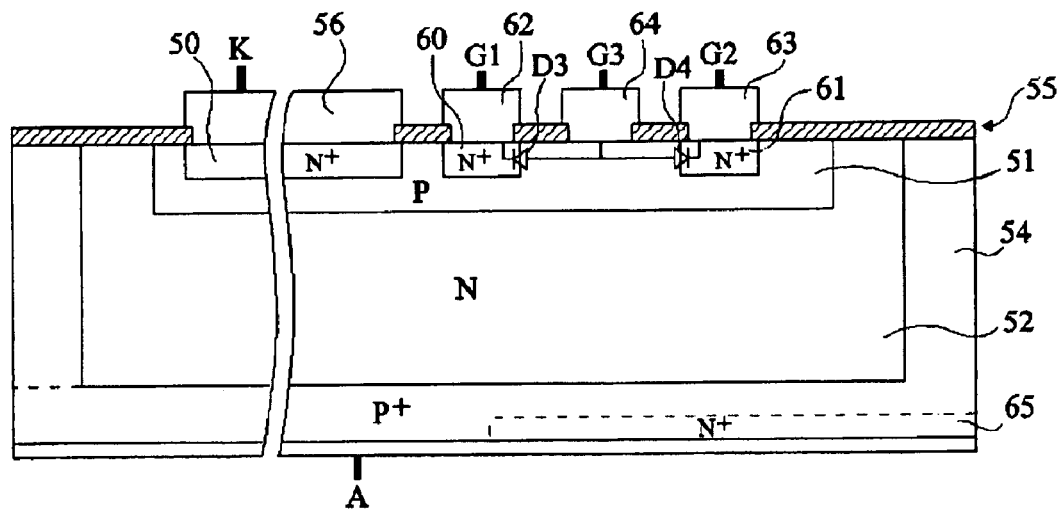
FIG. 7 is a cross-section view of a thyristor according to an embodiment of the present invention.

FIG. 7 is a cross-section view of a thyristor according to another embodiment of the present invention. The thyristor power area is substantially identical to that of the conventional thyristor of FIG. 1 and comprises a heavily-doped N-type cathode region 50, formed in a P-type well 51, itself formed in a lightly-doped N-type substrate 52, and a heavily-doped P-type anode region 53 on the rear surface side of the thyristor. Substrate 52 is surrounded with a P-type insulating wall 54 in contact with anode region 53. The front surface of the thyristor is covered with an insulating layer 55 except at various contact locations. A cathode metallization 56 connected to a terminal K is in contact with cathode region 50. The rear surface of the component is coated with an anode metallization 57 connected to an anode terminal A.

The thyristor elements specific to the present invention belong to a control area defined hereafter. Two heavily-doped N-type regions 60 and 61 are formed in well 51, to the right of region 50 in this example. Two metallizations 62 and 63 are respectively in contact with regions 60 and 61. A metallization 64 is in contact with a portion of well 51 located between N-type regions 60 and 61. Metallizations 62, 63, and 64 are respectively connected to three gate terminals G1, G2, and G3.

N-type region 60 and P-type well 51 form a diode D3 connected to gate terminals G1 and G3. N-type region 61 and P-type well 51 form a diode D4 connected to gate terminals G2 and G3.

Figure 8:
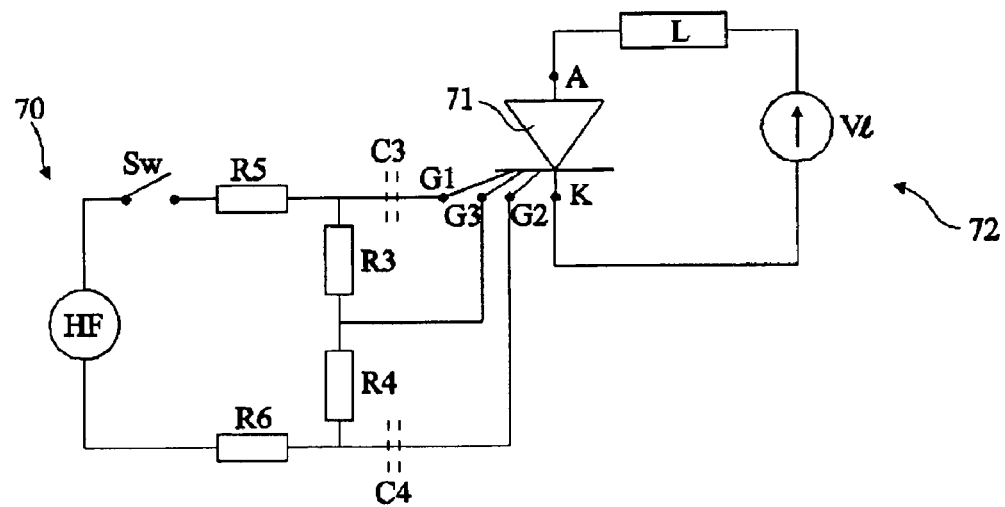
FIG. 8 is a diagram of a circuit of control and use of a thyristor such as shown in FIG. 7.

FIG. 8 is a diagram of a control circuit 70 of a thyristor 71 inserted in a power circuit 72. Thyristor 71 has the structure of the thyristor shown in FIG. 7. Power circuit 72 comprises a voltage generator V1 and a load L in series between anode A and cathode K of thyristor 71. Thyristor 71 is connected to control circuit 72, formed as previously of a switch Sw and of an HF generator, via a set of resistors. A resistor R3 is placed between gate terminals G1 and G3. A resistor R4 is placed between gate terminals G2 and G3. A resistor R5 is placed between gate terminal G1 and switch Sw. A resistor R6 is placed between gate terminal G2 and the HF generator.

When control circuit 72 is active, that is, when switch Sw is on, the activation sequence of diodes D3 and D4 is the following. On an HF halfwave, the current provided by the HF generator flows from R5 to R6 through R3 and R4. At the next halfwave of the HF generator, the current flows in the reverse direction from resistor R6 to resistor R5 through R3 and R4. The voltage across diode D3 is equal to the voltage across resistor R3. Similarly, the voltage across diode D4 is equal to the voltage across resistor R4. When the current flows from R5 to R6, diode D4 is conductive and when the current flows from R6 to R5, diode D3 is conductive. When one of diodes D3 and D4 is conductive, charges are "injected" in the vicinity of the blocking thyristor junction. The substantially continuous injection of charges enables rapid accumulation of charges and progressive creation of a current between anode A and cathode K of thyristor 70.

As previously, to improve the injection phenomenon, a heavily-doped N-type area 65 is preferably provided in P-type region 53 above the right-hand portion of well 51 in which regions 60 and 61 are formed.

Resistors R3 and R4 and thyristor 70 may easily be formed in the same semiconductor component. In this case, the component comprises four terminals: two anode and cathode terminals, A and K, and two gate terminals, G1 and G2.

Further, in the case where control circuit 70 is desired to be galvanically isolated from thyristor 71, two capacitors C3 and C4, shown in dotted lines, may respectively be provided between switch Sw and resistor R5 and between the HF generator and resistor R6. Similarly, capacitors C3 and C4 may be integrated in a component comprising resistors R3 and R4 and thyristor 71.

2. Triac 2.1. First Embodiment of a Triac

Figure 9:
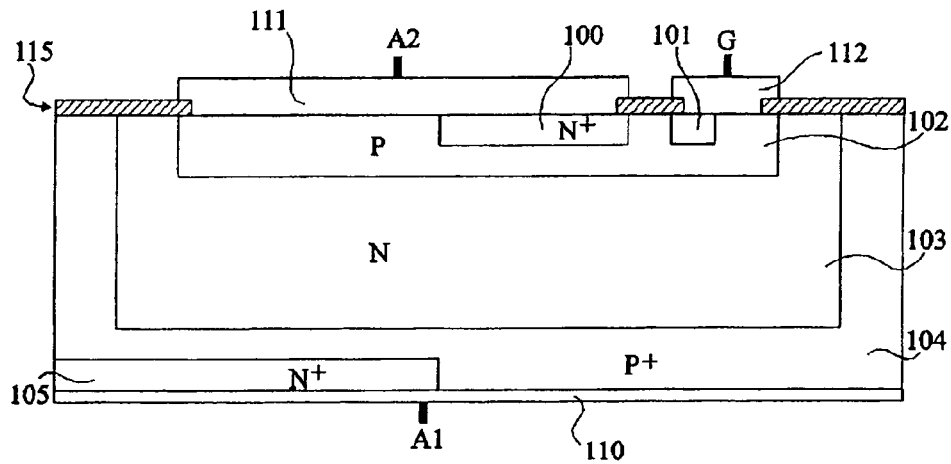
FIG. 9 is a cross-section view of a triac according to prior art.

FIG. 9 is a cross-sectional view of a conventional triac structure. The triac comprises two heavily-doped N-type regions 100 and 101, formed in a P-type well 102, itself formed in a lightly-doped N-type substrate 103, a heavily-doped P-type layer 104 adjacent to the lower portion of substrate 103, and a heavily-doped N-type region 105 formed in layer 104 on the rear surface side. The rear surface side of the component is coated with a metallization 110 connected to a terminal A1. A metallization 111 connected to a terminal A2 is in contact with a large portion of P-type well 102 and with N-type region 100. A metallization 112 connected to a gate terminal G is in contact with a small part of well 102 and with region 101. Metallizations 111 and 112 are surrounded with an insulating layer covering the front surface of the triac. Regions 100 and 101 are offset with respect to each other so that the portion of layer 104 located above region 100 is directly in contact with metallization 110 and that the portion of well 102 not taken up by region 100 is located above region 105.

When a triac is desired to be turned on, a current is injected or extracted through gate terminal G, which results in turning on one of the thyristors forming the triac.

Figure 10:
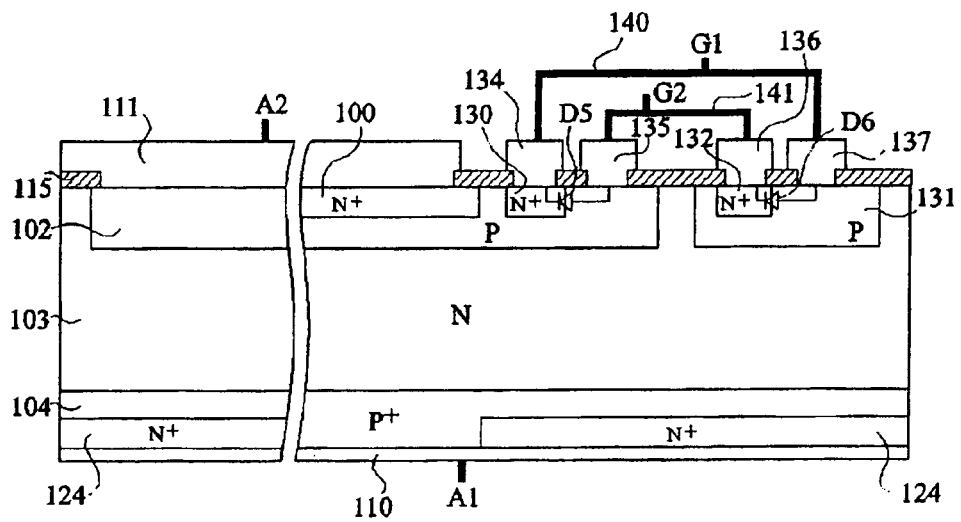
FIG. 10 is a cross-section view of a triac according to an embodiment of the present invention.

FIG. 10 is a cross-section view of a triac according to an embodiment of the present invention. The triac power area is substantially identical to that of the triac of FIG. 9. Region 105 is replaced with a region 124 which extends over the entire rear surface of the component except substantially opposite to region 110.

The elements specific to a triac according to the present invention belong to the control area defined hereafter. A heavily-doped N-type region 130 is formed in well 102 to the right of region 110 in this example. A P-type well 131 is formed in substrate 103, to the right of well 102. A heavily-doped N-type region 132 is formed in well 131. Four metallizations 134, 135, 136, and 137 are respectively in contact with region 130, a portion of well 102, region 132, and well 131. Metallizations 134 and 137 are connected by a schematically shown conductive line 140. Similarly, metallizations 135 and 136 are connected by a conductive line 141. Conductive lines 140 and 141 are respectively connected to gate terminals G1 and G2.

N-type region 130 and P-type well 102 form a diode D5. N-type region 132 and P-type well 131 form a diode D6. Diodes D5 and D6 are alternately forward biased by an HF signal on gate terminals G1 and G2.

Figure 11:
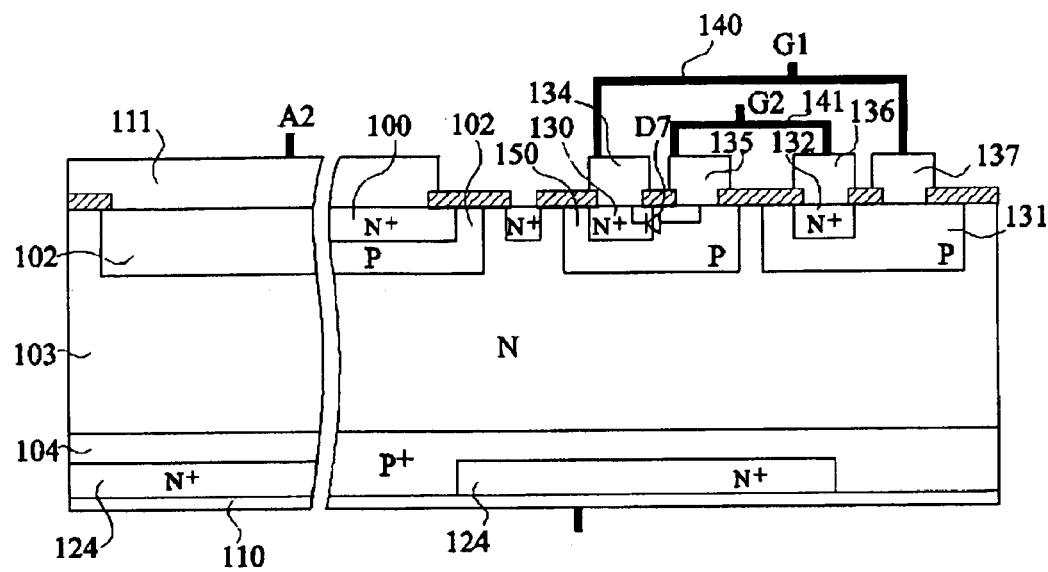
FIG. 11 is a cross-section view of a triac according to another embodiment of the present invention.

FIG. 11 is a cross-section view of a triac according to an alternative embodiment of the triac shown in FIG. 10. Region 130 is formed, not in well 102, but in a specific P-type well 150 placed in this example between well 102 and well 131. Metallization 135 is in contact with well 150. N-type region 130 and P-type well 150 form a diode D7. Conversely to the triac of FIG. 10 in which the anode of diode D5 is connected to terminal A2 and to terminal G2, the anode of diode D7 is only connected to terminal G2.

Figure 12:
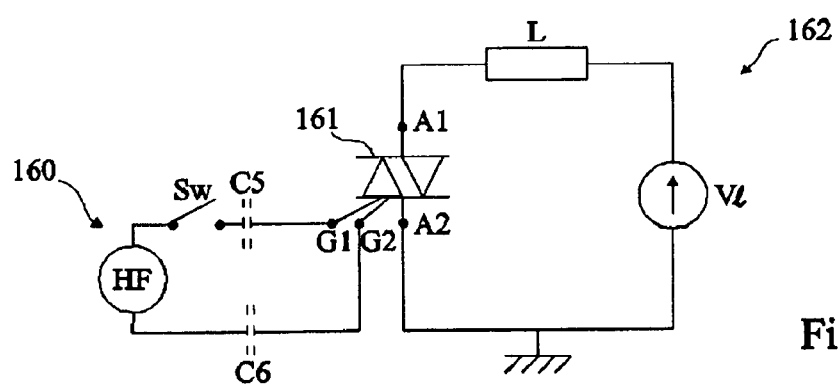
FIG. 12 is a diagram of a circuit of control and use of a triac such as shown in FIG. 10 or 11.

FIG. 12 is a diagram of a control circuit 160 of a triac 161 inserted in a power circuit 162. Triac 161 is such as shown in FIG. 10 or 11. Conversely to a conventional triac, the triac comprises two gate terminals G1 and G2. Power circuit 162 comprises a voltage generator V1 and a load L in series between terminals A1 and A2 of the triac. Gate terminals G1 and G2 of the triac are connected to control circuit 162 formed of a high frequency sinusoidal generator in series with a switch Sw.

In the case where control circuit 162 is desired to be galvanically isolated from triac 160, capacitors C5 and C6 may be placed respectively between gate terminal G1 and switch Sw and between the gate terminal and the HF generator. Capacitors C5 and C6 may be integrated in triac 161 by providing for example a thin dielectric layer between metallizations 134, 135, 136, and 137 and the anode and cathode regions of diodes D5, D6, and D7.

2.2. Second Embodiment of a Triac

Figure 13:
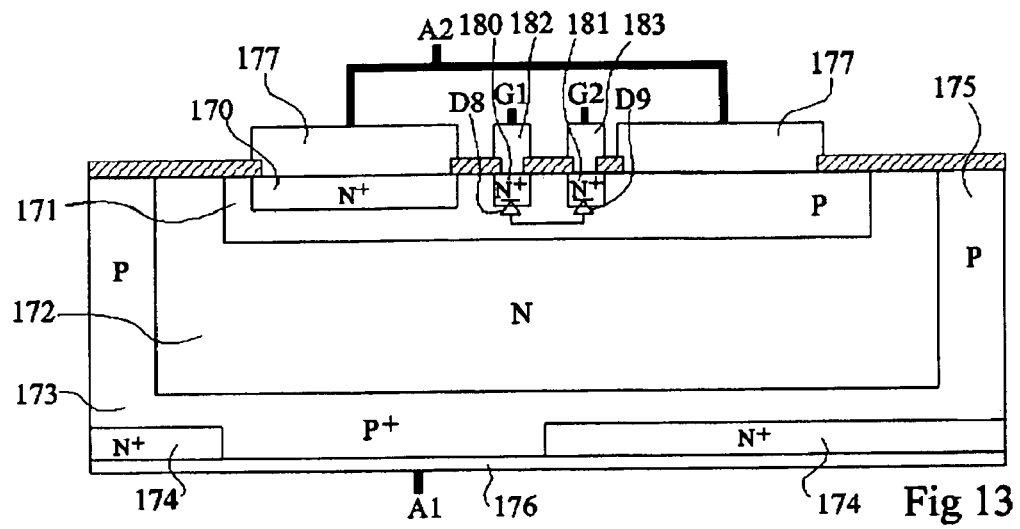
FIG. 13 is a cross-section view of a triac according to another embodiment of the present invention.
Figure 14:
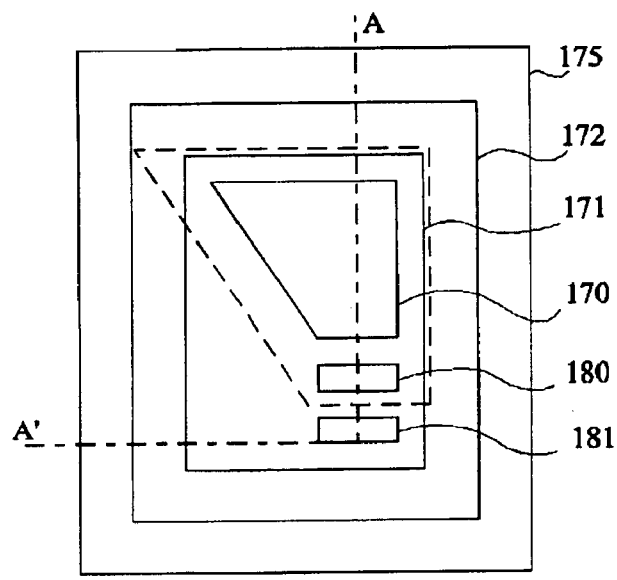
FIG. 14 is a top view of the triac shown in FIG. 13.

FIG. 13 is a cross-section view and FIG. 14 is a simplified top view of a triac according to another embodiment of the present invention. The triac power area is substantially identical to that of the triac of FIG. 9 and comprises a heavily-doped N-type region 170 formed in a P-type well 171, itself formed in a lightly-doped N-type substrate 172. A heavily-doped P-type layer 173 is placed under substrate 172. A heavily-doped N-type region 174 is formed in layer 173 on the rear surface side. Substrate 172 is surrounded with an insulating wall formed of a lightly-doped P-type layer 175. Well 171 has in top view a substantially rectangular shape. Region 170 substantially has the shape of a truncated rectangle from which a corner is missing. Region 170 is placed substantially towards the top of well 171. Substrate 172 of substantially rectangular shape surrounds well 171. Insulating wall 175 has a substantially rectangular shape and surrounds substrate 172. N-type rear surface region 174 is formed in a large portion of layer 173 except in a portion of layer 173 located above N-type region 170. The portion of layer 173 not taken up by region 174 is shown in dotted, lines in FIG. 14.

The elements specific to a triac according to the present invention belong to the control area defined hereafter. Two heavily-doped N-type regions 180 and 181 are formed in P-type well 171. Regions 180 and 181 have in top view a substantially rectangular shape and are placed under region 170, to the bottom right of well 171. Two metallizations 182 and 183 are respectively in contact with regions 180 and 181 and are respectively connected to two gate terminals G1 and G2. N-type region 180 and P-type well 171 form a diode D8 connected to terminals G1 and A2. N-type region 181 and P-type well 171 form a diode D9 connected to terminals G2 and A2. A contact G3 may also be provided on well 71, similarly to what is shown in FIG. 7.

Figure 15:
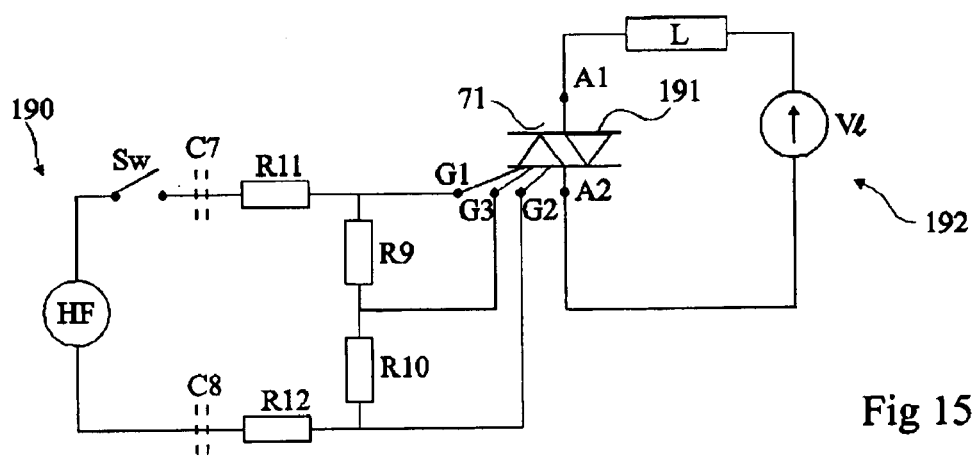
FIG. 15 is a diagram of a circuit of control and use of a triac such as shown in FIGS. 13 and 14.

FIG. 15 is a diagram of a control circuit 190 of a triac 191 inserted in a power circuit 192. Triac 191 has the structure of the triac shown in FIGS. 13 and 14. The triac comprises gate terminals G1, G2, and G3. Power circuit 192 comprises a voltage generator V1 and a load L in series between terminals A1 and A2 of triac 191. Triac 190 is connected to control circuit 190, comprising an HF generator and a switch Sw in series, via a set of resistors. Two resistors R9 and R10 are connected in series between gate terminals G1 and G2. A resistor R11 is placed between gate terminal G1 and switch Sw. A resistor R12 is placed between gate terminal G2 and the HF generator. The junction point of resistors R9 and R10 is connected to terminal G3 (or to terminal A2 of triac 191). When switch Sw is on, the current flows from R11 to R12 during a halfwave of the HF generator and from R12 to R11 at the next halfwave. When the current flows from R11 to R12, diode D9 is conductive and when the current flows from R12 to R11, diode D8 is conductive.

To galvanically isolate the control circuit from triac 191, it may be provided to place two capacitors C7 and C8 between resistor R11 and switch Sw and between resistor R12 and the HF generator.

3. Controlled Bidirectional Switch

Figure 16:
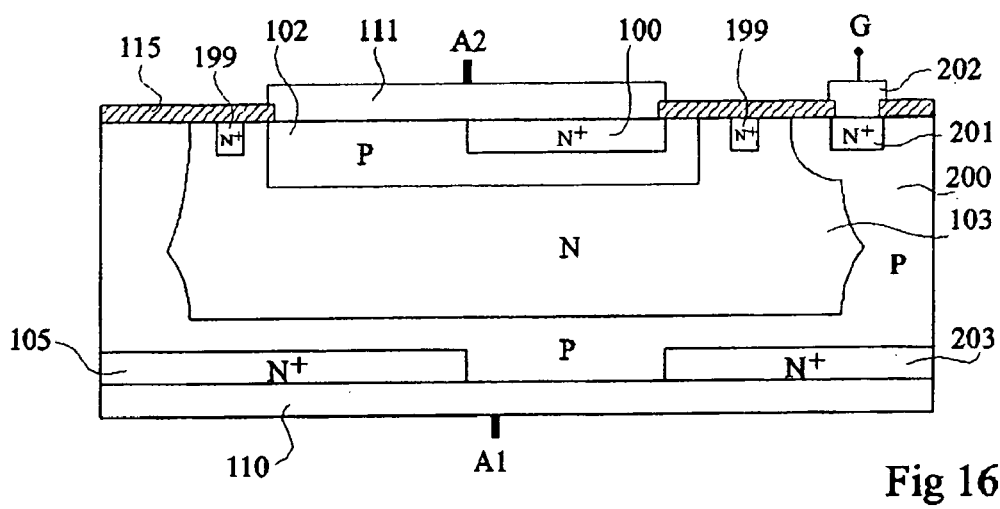
FIG. 16 is a cross-section view of a bi-directional switch according to prior art.

FIG. 16 shows a conventional controlled bi-directional switch in which the gate voltage is referenced to rear surface terminal A1 and not to front surface terminal A2. The power portion of such a component is similar to the power portion of a conventional triac such as illustrated in FIG. 9 and same elements have been designated with same reference numerals. A channel stop ring 199 surrounding the power portion has further been shown. In such components, the gate region is formed in lateral P-type wall 200. The power portion essentially comprises a heavily-doped N-type region 201 formed on the upper surface side of the insulating wall and connected by a metallization 202 to a gate terminal G. An N$^+$ region 203 completing N$^+$ region 105 on the rear surface side so that N$^+$ regions 105 and 203 practically cover the entire rear surface portion of the component which does not face N$^+$-type region 100 has also been shown. As can be seen, the gate region is arranged in the insulating wall, itself solid with terminal A1. The voltage on gate G is thus referenced to terminal A1, which in many cases simplifies the assembly and the control of a bi-directional switch for which surface A1 is desired to be connected to a radiator at the ground potential.

Several means may be used to transform such a controlled bi-directional switch into an HF-controlled switch according to the present invention.

A first means (not shown) comprises inserting two diodes such as the diodes provided in wells 131 and 150 of FIG. 11 in the immediate vicinity of the upper portion of insulating wall 200. The carriers will then accumulate upon application of the HF signal and will diffuse into the well towards the P region in contact with electrode A1.

Figure 17:
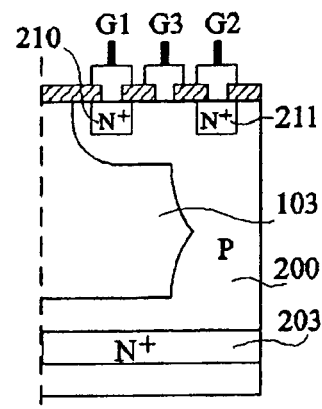
FIG. 17 is a partial cross-section view illustrating the turn-on area of a bidirectional switch according to an embodiment of the present invention.

Another means is illustrated in FIG. 17 and uses a structure similar to that described in relation with FIGS. 7 and 13, but this turn-on structure is then placed in the upper portion of insulating wall 200. This structure comprises a first N-type region 210 and a second N-type region 211, respectively connected to terminals G1 and G2. A contact is taken on the upper portion of the insulating wall and is solid with a terminal G3. The turn-on control can be easily induced from the foregoing.

The present invention applies to any type of SCR switch comprising at least four "main" semiconductor layers of alternate doping type between two main power terminals. A switch according to the present invention comprises at least two control regions connected to two control terminals of the switch. The control regions are formed in a main layer of the switch or in a specific control well formed in a main layer. The control regions form with the main layer and/or the control well(s) in which are formed two diodes, each of which, when on, generates carriers capable of activating the switch. The electrodes of each of the diodes are connected to a control terminal or to a main terminal. By applying a high-frequency signal across each of the diodes so that each of the two diodes is alternately conductive, it is possible to have almost permanently a conductive diode which injects carriers. The continuous injection of charge carriers enables significantly decreasing the switch activation time.

Further, in an SCR switch according to the present invention, the control elements and the power elements are distinct, which enables optimizing their characteristics independently from one another.

Of course, the present invention is capable of having various alterations, modifications, and improvements which will readily occur to those skilled in the art. In particular, those skilled in the art may devise various embodiments of two control diodes in a conventional SCR switch structure. Further, it will be within the abilities of those skilled in the art to design other activation circuits of the two control diodes of a switch according to the present invention.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A semiconductor device, comprising:
a vertical SCR-type switch having a control area comprising a first control region forming a first diode with a first neighboring region or layer, wherein:
the control area further comprises a second control region forming a second diode with a second neighboring region or layer,
a contact is respectively formed on each of the first and second control regions and on each of the first and second neighboring regions or layers,
said contacts are connected to terminals of application of an A.C. control voltage so that, when an A.C. voltage is applied, each of the two diodes is alternately conductive.

2. The semiconductor device of claim 1, comprising at least four "main" semiconductor layers of alternate doping types through which a significant current is capable of running from the front surface to the rear surface between two main terminals, and wherein the first and second control regions are each formed either in one of the main layers or in a control well formed in one of the main layers, the two control regions forming with the main layer or the control well(s) in which they are formed two diodes each capable of starting the switch and wherein, for each diode, the electrode corresponding to a control region is connected to a first control terminal by one of said contacts, the other electrode being connected to a main terminal or to a second control terminal by one of said contacts, the switch being capable of being activated by a circuit applying an A.C. voltage such that each of the two diodes is alternately conductive.

3. The semiconductor device of claim 2, wherein the first main layer is formed on the front surface side in the second main layer, the second layer and the third and the fourth main layers emerging on the front surface side, and the two control regions are each formed in one of the second, third, or fourth layers, and the control wells are formed in one of the third or fourth main layers.

4. The semiconductor device of claim 3, of thyristor type, comprising four main layers: a cathode region of a first doping type on the upper surface side, formed in a well of a second doping type, itself formed in a substrate of the first doping type, and an anode region of the second doping type formed on the rear surface side, the cathode region being connected to a main cathode terminal, the anode region being connected to a main anode terminal.

5. The semiconductor device of claim 4, wherein each of the two control regions are regions of the first doping type formed in said well, a metallization connected to a second control terminal being in contact with said well.

6. The semiconductor device of claim 4, wherein the two control regions are first and second regions of the first doping type, the first region being formed in said well, the second region being formed in a second well of the second doping type formed in said substrate, the first region being connected to the second well and to one of the control terminals, the second region being connected to said well and to the other control terminal.

7. A semiconductor device, comprising:
a vertical SCR-type switch having a control area comprising a first control region that forms a first diode with a first neighboring region, wherein:
the control area further comprises a second control region that forms a second diode with a second neighboring region,
the first and second diodes being constructed and arranged so that, upon application of an A.C voltage, each of the two diodes is alternately conductive.

8. The semiconductor device of claim 7, further comprising a contact respectively provided on each of the first and second control regions and on each of the first and second neighboring regions.

9. The semiconductor device of claim 8, comprising at least four "main" semiconductor layers of alternate doping types through which a significant current is capable of running from the front surface to the rear surface between two main terminals, and wherein the first and second control regions are each formed either in one of the main layers or in a control well formed in one of the main layers, the two control regions forming with the main layer or the control well(s) in which they are formed two diodes each capable of starting the switch and wherein, for each diode, the electrode corresponding to a control region is connected to a first control terminal by one of said contacts, the other electrode being connected to a main terminal or to a second control terminal by one of said contacts, the switch being capable of being activated by a circuit applying an A.C. voltage such that each of the two diodes is alternately conductive.

10. The semiconductor device of claim 9, wherein the first main layer is formed on the front surface side in the second main layer, the second layer and the third and the fourth main layers emerging on the front surface side, and the two control regions are each formed in one of the second, third, or fourth layers, and the control wells are formed in one of the third or fourth main layers.

11. The semiconductor device of claim 10, of thyristor type, comprising four main layers: a cathode region of a first doping type on the upper surface side, formed in a well of a second doping type, itself formed in a substrate of the first doping type, and an anode region of the second doping type formed on the rear surface side, the cathode region being connected to a main cathode terminal, the anode region being connected to a main anode terminal.

12. The semiconductor device of claim 11, wherein each of the two control regions are regions of the first doping type formed in said well, a metallization connected to a second control terminal being in contact with said well.

13. The semiconductor device of claim 11, wherein the two control regions are first and second regions of the first doping type, the first region being formed in said well, the second region being formed in a second well of the second doping type formed in said substrate, the first region being connected to the second well and to one of the control terminals, the second region being connected to said well and to the other control terminal.

* * * * *